United States Patent [19]
Roza

[11] Patent Number: 5,214,573
[45] Date of Patent: May 25, 1993

[54] SPACER

[75] Inventor: Ivan Roza, Olten, Switzerland

[73] Assignee: Elektro-Apparatebau Olten AG, Olten, Switzerland

[21] Appl. No.: 840,553

[22] Filed: Feb. 25, 1992

[30] Foreign Application Priority Data

Mar. 5, 1991 [CH] Switzerland .................. 00660/91

[51] Int. Cl.[5] .............................................. H05K 7/02
[52] U.S. Cl. .................. 361/417; 174/138 D; 361/346; 361/380; 361/420
[58] Field of Search .................. 174/138 D; 200/296; 248/271; 361/331, 346, 380, 412, 417, 419, 420

[56] References Cited

U.S. PATENT DOCUMENTS

| | | |
|---|---|---|
| 3,812,381 | 5/1974 | Guyton . |
| 4,309,856 | 1/1982 | Varnau et al. .................. 361/412 |
| 4,875,140 | 10/1989 | Delpech et al. .................. 361/412 |
| 4,901,204 | 2/1990 | Hayashi .................. 361/412 |
| 4,969,065 | 11/1990 | Petri .................. 361/412 |
| 4,970,761 | 11/1990 | Nakamura .................. 174/138 D |

FOREIGN PATENT DOCUMENTS 3539361 5/1987 Fed. Rep. of Germany .

Primary Examiner—Gregory D. Thompson
Attorney, Agent, or Firm—Oblon, Spivak, McClelland, Maier & Neustadt

[57] ABSTRACT

A spacer which serves to space and connect two panels which are arranged parallel, one behind the other, in particular for uniform distance setting between the front panel of a switchboard and a backside, parallel printed circuit board. The spacer includes a socket and a plug member which is engageable with the socket. The socket exhibits, concentrically around its central axis, at least four guides that are open in the direction of the plug member and which have a depth defined by stop faces of the socket. These guides form groups of varying depth, which lie radially symmetrically to the central axis, and the plug member has on a side thereof facing the socket, projections which are rotatable into suitable positions into the guides of a group.

8 Claims, 2 Drawing Sheets

SPACER

BACKGROUND OF THE INVENTION

1. Field of the Invention

The present invention relates to a spacer for two panels to be arranged parallel, one behind the other.

2. Discussion of the Background

During its construction a printed circuit board is often attached parallel with and a distance behind the front panel of the switchboard. For this purpose spacer pins with tapped holes in the end-sided faces are used. These spacer pins are positioned at right angles to and are located between the front panel and the printed circuit board and are thereupon screwed together by means of screws, screwed through said panel and board or welded to the front panel. Affixing boreholes in the board and panel for the attachment screws requires very high accuracy and is possible only with boring templates. In addition, the assembly of both panel and board and the spacer is quite time consuming. Another drawback lies in the fact that for each desired board distance spacers of suitable length must be kept in supply. If the spacer pins are welded to the front panel, the front panel requires a new surface treatment.

SUMMARY OF THE INVENTION

The object of the present invention is to provide a spacer of the aforementioned kind in such a manner that with a single design several different panel distances can be obtained. This problem is solved, according to the invention, in accordance with the features now claimed.

If, with a spacer according to the invention, symbols corresponding to the depth of the individual guides are affixed on the upper side of the socket, said symbols simultaneously provide information about the height of the spacer and only the projections of the plug member have to be inserted into the guides targeted, so that the spacer adjusts itself to the desired board distance.

To decrease even more the time-consuming centering and assembly work when assembling a switchboard, a spacer is proposed in the present invention. In so doing, the assembly is simplified most extensively in accordance with the preferred embodiment. When such spacers are used, the socket is screwed first to the printed circuit board and thereupon the plug member is locked into said socket with the desired distance requirement. If several spacers are attached in this manner to the printed circuit board, the protective film is removed from its self-sticking layer and subsequently the front panel makes contact with the spacers, thus resting on its supports. At this stage the printed circuit board can be slid onto said supports with only negligible static friction into the desired position (i.e., centered). When it is in the desired position, it is pressed against the front panel. Under this pressure the supports bend, permanently being deformed, outwardly, until the front panel touches the self-adhesive layer and adheres firmly to it. Any other connection between the front panel and the printed circuit board can be dispensed with.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENT

Figure 1:
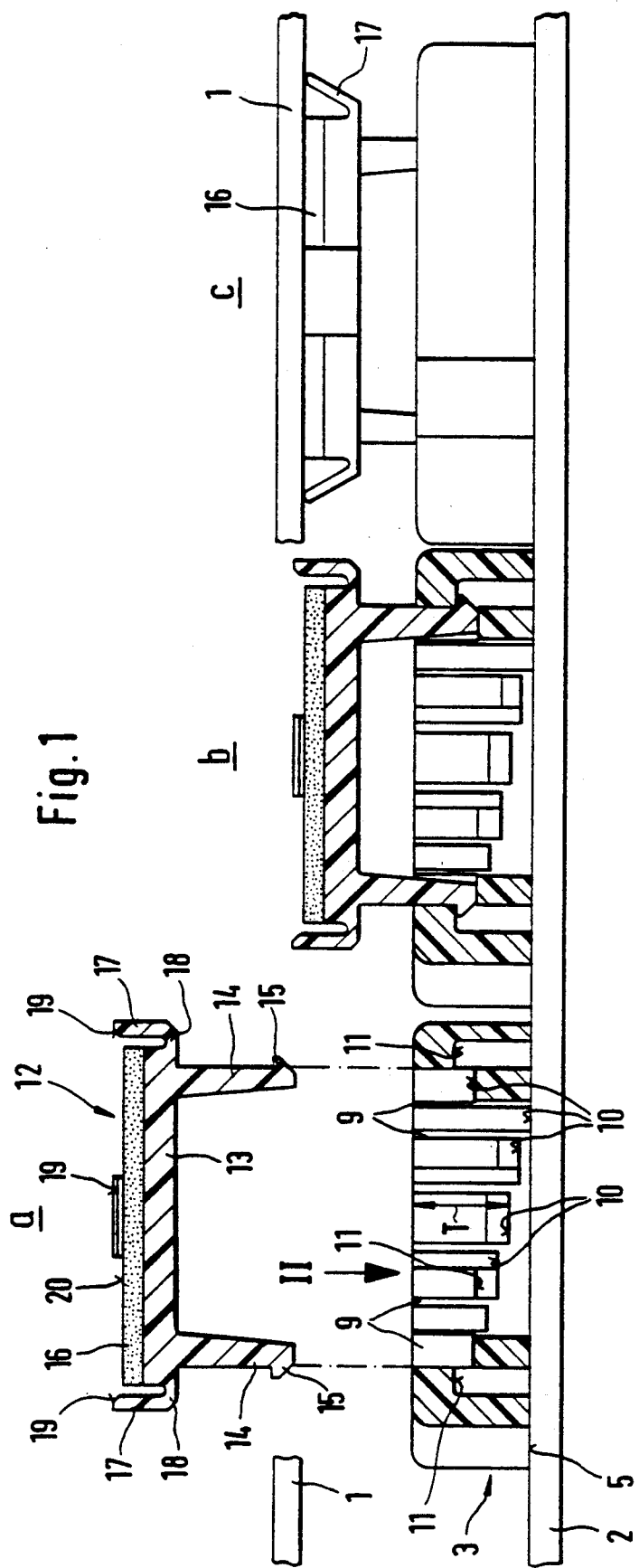
FIG. 1 is a cross sectional view of a switchboard taken along line I—I in FIG. 2.
Figure 2:
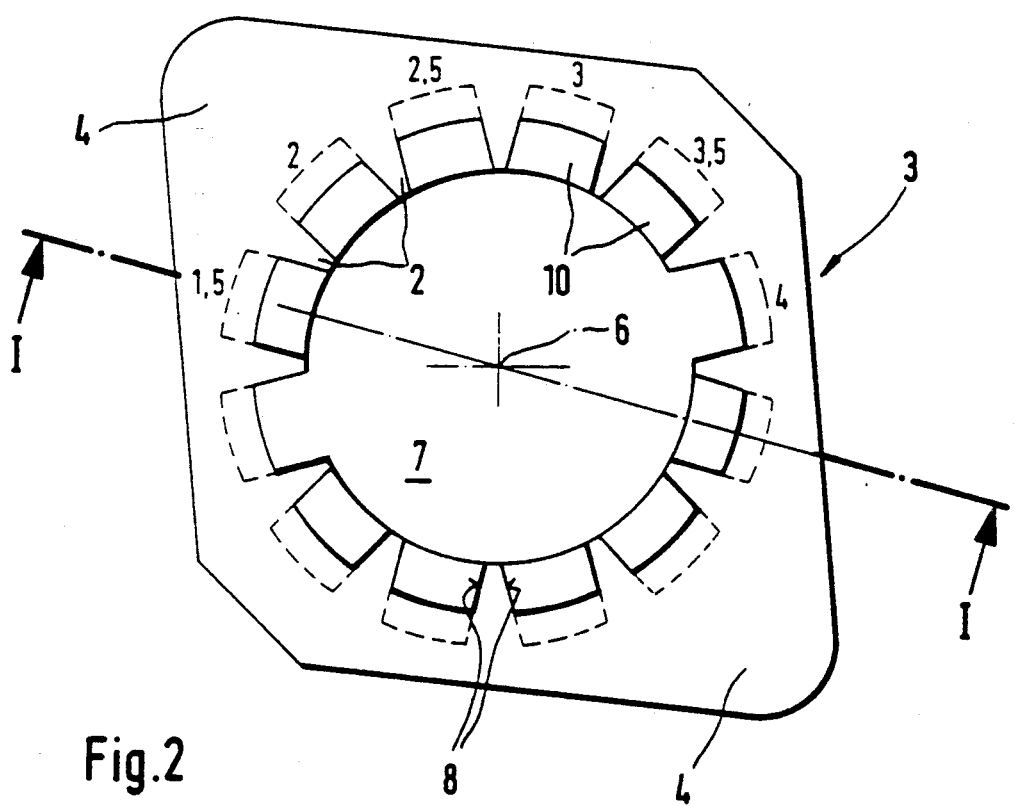
FIG. 2 is a view of a spacer socket taken in the direction of arrow II in FIG. 1.

In the drawing reference, numerals 1 and 2 denote the front panel and the printed circuit board of a switchboard. The front panel 1 and the printed circuit board 2 are connected together and are spaced apart by means of several spacers. FIG. 1 represents the same spacer in three different assembly phases a, b and c. The spacer exhibits a socket 3, which is attached to the printed circuit board 2 and which forms in the direction of opposite sides, two attachment tongues 4, by means of which the attachment screws are screwed into the printed circuit board 2. The socket 3 touches the printed circuit board 2 with a flat contact face 5, positioned at right angles to the center axis 6 of said socket, and exhibits a passage 7, whose cross section is circular and which is axial to the center axis 6 of said socket. Parallel-axis guides 8, which are separated by walls 9, border the passages 7. The depth T of each guide 8 is defined or determined by a stop face 10, as shall be explained hereafter.

Guides 8 are arranged radially symmetrically and in whole numbers around the center axis 6 of socket 3, whereby two diametrically (thus point-symmetrically) opposing guides 8 have the same depth T and form together one group. There are six groups in the example shown. On the upper side of the socket, each group is denoted by a number that characterizes the depth T of guides 8 and which simultaneously refers to the height of the assembled spacer. It is clear from the numbers given that the depth of the guides 8 differs from group to group and is graduated by the same amount. In addition, an undercut shoulder 11, which is a part of a lock connection with a plug member 12 described below, is assigned to each of the guides 8.

The plug member 12 complementary to the socket 3 is provided with two projections 14 and project from a panel 13 to the rear and each of which has a latch member 15 pointing outwardly. If the plug member 12 is plugged into the socket 3, the diametrically opposing projections 14 slide towards the bottom with their latch members 15 onto the base of two opposing guides 8 forming a group, whereby they are elastically bent. As the projections 14 engage the stop faces 10, the latches pass the shoulder 11 and lock with the shoulder. Thus, the plug member 12 cannot be lost and is held without any clearance on the socket 3. Depending on the rotary position of the plug member 12, the projections 14 are located in guides 8 of a group with reference numerals 1.5, 2, 2.5, 3, 3.5 or 4 and the height of the spacer is fixed to match.

On its upper side the panel 13 of the plug member 12 is provided with a self-adhesive layer 16 covered by a protective film. The self-adhesive layer forms a second contact face 20, which must make contact with the backside of the front panel 1. Above the self-adhesive layer 16 there protrudes four supports 17, which are arranged radially symmetrically and whose free ends project slightly above the self-adhesive layer 16. These supports are fabricated as one piece with the panel 13 and are connected to said panel with a bendable connection 18. The upper free ends of said supports have an inclined surface tilted towards the self-adhesive layer 16.

If the plug member 12 is attached, as shown in FIG. 1 for assembly phase b, in the socket 3, front panel 1 and supports 17 can be placed against one another. If the printed circuit board lies on the front panel, the load is so small that in the region of the bending connection 18 virtually no deformation of the supports 17 occurs. In this position of the supports 17, the front panel can be easily slid on the supports. At this stage, the front panel 1 is slid onto the supports 17 until the panel assumes precisely the position intended. In this position the front panel 1 is pressed against the printed circuit board 2, whereby the supports 17 are bent outwardly (partially due to the inclined faces 19 - FIG. 1c). If the protective film is removed from the self-adhesive layer 16, the front panel 1 adheres to the self-adhesive layer. Its adhesion is so great that any reset forces that might still exist can be virtually overlooked in the supports 17 (namely in the region of the bending connection 18). As soon as the front panel 1 adheres to the self-adhesive layer 16, it is connected not only to the printed circuit board 2 but also precisely parallel with respect to said printed circuit board 2 and at the desired distance determined by the plug position of the plug member 12 in accordance with the height of the spacer.

According to a further embodiment (not shown) it is also possible to arrange the guides 8 that belong to one group not point-symmetrically but rather radial-symmetrically around the axis 6, whereby one group can comprise three or four guides. In this case three or four projections 14 should be arranged radially symmetrically on the plug member. Furthermore, it is possible to provide the socket 3 with a rotationally symmetrical circumferential line and to arrange the guides 8 on the exterior of the socket.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the U.S. is:

1. A spacer for a first and second panel arranged parallel to one another for providing uniform spacing, preferably between a front panel of a switchboard and a backside, parallel printed circuit board, which comprises:
    a socket with a first contact face for engaging said first panel; and
    a plug member with a second contact face for engaging said second panel, said plug member being slidable in or over said socket and positioned so as to engage said socket, wherein said socket has concentrically positioned around a central axis thereof at least four guide members, said guide members being located on said socket, being open in the direction of said plug member and having a depth which is defined by stop faces of said socket, wherein said guide members form groups of varying depth, which lie radially symmetrically with respect to a central axis, and wherein said plug member has on a side thereof facing said socket a plurality of projections which are rotatably positionable into said guide members of said groups.

2. A spacer according to claim 1, wherein said projections include means for lockably engaging said socket upon said projections abutting said stop faces.

3. A spacer according to claim 1, wherein the depth dimension of said guide members is uniformly graduated between said groups.

4. A spacer for a first and second panel arranged parallel to one another for providing uniform spacing, preferably between a front panel of a switchboard and a backside, parallel printed circuit board, which comprises:
    a socket with a first contact face for engaging said first panel; and
    a plug member with a second contact face for engaging said second panel, said plug member being slidable in or over said socket and positioned so as to engage said socket, wherein said socket has concentrically positioned around a central axis thereof at least four guide members, said guide members being located on said socket, being open in the direction of said plug member and having a depth which is defined by stop faces of said socket, wherein said guide members form groups of varying depth, which lie radially symmetrically with respect to a central axis, and wherein said plug member has on a side thereof facing said socket a plurality of projections which are rotatably positionable into said guide members of said groups, said contact faces being located at right angles to said central axis of said socket, and said second contact face comprising an adhesive layer with supports protruding uniformly therefrom, said supports including a flexible segment.

5. A spacer according to claim 4, wherein the free end of said supports includes a surface tilted towards said second contact face of said plug member.

6. A spacer, according to claim 4, wherein said adhesive layer comprises a self-adhesive film.

7. A spacer according to claim 4 wherein said supports are arranged radially symmetrically around the central axis of the spacer.

8. A spacer according to claim 1, wherein said socket comprises attachment members for providing one of a form-locking and force-locking attachment to said second panel.

* * * * *